United States Patent
Monfray et al.

(10) Patent No.: US 9,722,166 B2
(45) Date of Patent: Aug. 1, 2017

(54) TUNNEL-EFFECT POWER CONVERTER

(71) Applicants: STMicroelectronics (Crolles 2) SAS, Crolles (FR); Centre National de la Recherche Scientifique, Paris (FR)

(72) Inventors: Stéphane Monfray, Eybens (FR); Thomas Skotnicki, Crolles-Monfort (FR); Emmanuel Dubois, Quesnoy sur Deule (FR)

(73) Assignees: STMICROELECTRONICS (CROLLES 2) SAS, Crolles (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 810 days.

(21) Appl. No.: 13/741,201

(22) Filed: Jan. 14, 2013

(65) Prior Publication Data
US 2013/0180562 A1 Jul. 18, 2013

(30) Foreign Application Priority Data

Jan. 18, 2012 (FR) ..................... 12 50497

(51) Int. Cl.
| H02N 1/00 | (2006.01) |
| H01L 35/32 | (2006.01) |
| H01L 37/00 | (2006.01) |
| H01J 45/00 | (2006.01) |

(52) U.S. Cl.
CPC ............. *H01L 35/32* (2013.01); *H01J 45/00* (2013.01); *H01L 37/00* (2013.01)

(58) Field of Classification Search
CPC ........ H01L 35/32; H01L 37/00; H01J 45/00; H02N 1/08
USPC ................................. 310/306, 309
See application file for complete search history.

(56) References Cited

U.S. PATENT DOCUMENTS

| 6,117,344 | A | 9/2000 | Cox | |
| 7,851,968 | B2* | 12/2010 | Chaillout | H02N 1/08 310/308 |
| 8,803,401 | B2* | 8/2014 | Nakatsuka | H02N 1/08 310/300 |
| 9,000,652 | B2* | 4/2015 | Kimura | H01J 45/00 136/200 |
| 2003/0042819 | A1 | 3/2003 | Martinovsky | |
| 2006/0130489 | A1 | 6/2006 | Weaver | |
| 2006/0284539 | A1 | 12/2006 | Sung | |
| 2007/0120438 | A1* | 5/2007 | Divoux | 310/309 |
| 2008/0203849 | A1 | 8/2008 | Hagg | |
| 2009/0194870 | A1 | 8/2009 | Nathanson | |

OTHER PUBLICATIONS

French Search Report and Written Opinion dated Nov. 16, 2012 from corresponding French Application No. 12/50497.
Shakouri A, Nanoscale *Thermal Transport and Microrefrigerators on a Chip*, Proceedings of the IEEE, IEEE, New York, vol. 94, No. 8, Aug. 1, 2006., pp. 1613-1638, XP011370714.

(Continued)

*Primary Examiner* — Hanh Nguyen
*Assistant Examiner* — Leda Pham
(74) *Attorney, Agent, or Firm* — Seed IP Law Group LLP

(57) ABSTRACT

A tunnel-effect power converter including first and second electrodes having opposite surfaces, wherein the first electrode includes protrusions extending towards the second electrode.

23 Claims, 4 Drawing Sheets

(56) References Cited

OTHER PUBLICATIONS

Clément et al., "Electronic transport mechanisms in scaled gate-all-around silicon nanowire transistor arrays," *Applied Physics Letters* 103:263504, 2013, 5 pages.
Fisher et al., "Thermal and Electrical Energy Transport and Conversion in Nanoscale Electron Field Emission Processes," *Transactions of the ASME* 124:954-962, Oct. 2002.
Hatsopoulos et al., "Measured Thermal Efficiencies of a Diode Configuration of a Thermo Electron Engine," *Journal of Applied Physics* 29:1124-1125, 1958.
Houston, "Theoretical Efficiency of the Thermionic Energy Converter," *Journal of Applied Physics* 30(4):481-487, Apr. 1959.
Shim et al., "Hard-tip, soft-spring lithography," *Nature* 469:516-520, Jan. 2011.
Sonnenberg, "Low-Work-Function Surfaces for Negative-Electron-Affinity Photoemitters," *Applied Physics Letters* 14(9):289-291, May 1969.
Wilson, "Conversion of Heat to Electricity by Thermionic Emission," *Journal of Applied Physics* 30(4):475-481, Apr. 1959.
Wu et al., "Photoemission study of the effect of annealing temperature on a $K_2O_2$/Si(100) surface," *Physical Review B* 60(24):17102-17106, Dec. 1999.

\* cited by examiner

TUNNEL-EFFECT POWER CONVERTER

CROSS REFERENCE TO RELATED APPLICATIONS

This application claims the priority benefit of French patent application number 12/50497, filed on Jan. 18, 2012, which is hereby incorporated by reference to the maximum extent allowable by law.

BACKGROUND

Technical Field

The present disclosure relates to power conversion devices, and more specifically to devices enabling to convert heat into electric power.

Discussion of the Related Art

FIG. 1 is a perspective view schematically showing an example of a device 1 enabling to convert heat into electric power. Device 1 comprises two electrodes 3 and 5 having opposite surfaces separated by a distance which is on the order of atomic dimensions, for example, on the order of a few nanometers. Here and in the following description, "opposite surfaces" means surfaces facing each other and between which no solid material is interposed. Electrodes 3 and 5 are for example made of metal or of a semiconductor material such as silicon. Electrodes 3 and 5 may further comprise, on the side of their opposite surfaces, a thin coating (respectively 4 for electrode 3 and 6 for electrode 5) of an electrically conductive material of low work function, for example a metal such as cesium, or a metal oxide such as potassium peroxide ($K_2O_2$) or a cesium oxide ($Cs_2O$). To maintain the opposite surfaces at the desired distance, spacers 7 made of an insulating material are arranged between electrodes 3 and 5 in certain regions of device 1. The free space between the opposite surfaces of electrodes 3 and 5 and spacers 7 may be placed under vacuum or filled with an inert gas.

In operation, electrode 3, also called emitter, is heated up to a temperature $T_H$, and electrode 5, also called collector, is maintained at a temperature $T_C$ lower than temperature $T_H$. By thermionic barrier effect, electrons are extracted from hot electrode 3 and cross the potential barrier which separates them from cold electrode 5. The short distance separating opposite electrode surfaces makes the electron transport from electrode 3 to electrode 5 by tunnel effect easier. There thus is an electron flow between hot electrode 3 and cold electrode 5 and, when a load 9 (LOAD) is connected between electrodes 3 and 5, a current flows through the load going from cold electrode 5 (positive electrode) to hot electrode 3 (negative electrode).

Power conversion devices of this type, exploiting both thermionic emission and tunnel-effect conduction phenomena, are generally called tunnel-effect power converters, or thermionic power converters, or tunnel-effect thermionic power converters.

It would be desirable to be able to improve the performance, and especially the power conversion efficiency, of tunnel-effect converters.

SUMMARY

An embodiment provides a tunnel-effect power converter overcoming at least some of the disadvantages of known converters.

An embodiment provides a tunnel-effect power converter which has a better conversion efficiency than known converters.

An embodiment provides a method for manufacturing a tunnel-effect power converter.

Thus, an embodiment provides a tunnel-effect power converter comprising first and second electrodes having opposite surfaces, wherein the first electrode comprises protrusions extending towards the second electrode.

According to an embodiment, the second electrode comprises protrusions extending towards the protrusions of the first electrode.

According to an embodiment, the protrusions of the second electrode face the protrusions of the first electrode.

According to an embodiment, the converter comprises at least one third electrode, the second and third electrodes having opposite surfaces.

According to an embodiment, the second electrode comprises protrusions extending towards the third electrode.

According to an embodiment, the third electrode comprises protrusions extending towards the protrusions of the second electrode.

According to an embodiment, said protrusions are point-shaped.

According to an embodiment, the points have a height ranging between 5 and 25 nm.

According to an embodiment, the minimum distance separating said opposite surfaces ranges between 1 and 30 nm.

According to an embodiment, the electrodes comprise silicon.

According to an embodiment, the surfaces are coated with a material from the group comprising cesium, cesium oxides, and potassium peroxide.

Another embodiment provides a method for manufacturing a tunnel-effect power converter of the above-mentioned type, comprising: forming resin or oxide islands masking regions of a single-crystal silicon layer; partially thinning the single-crystal silicon layer by means of a solution preferentially etching oblique crystal planes of said layer.

The foregoing and other features and advantages will be discussed in detail in the following non-limiting description of specific embodiments in connection with the accompanying drawings.

DETAILED DESCRIPTION

Figure 1:
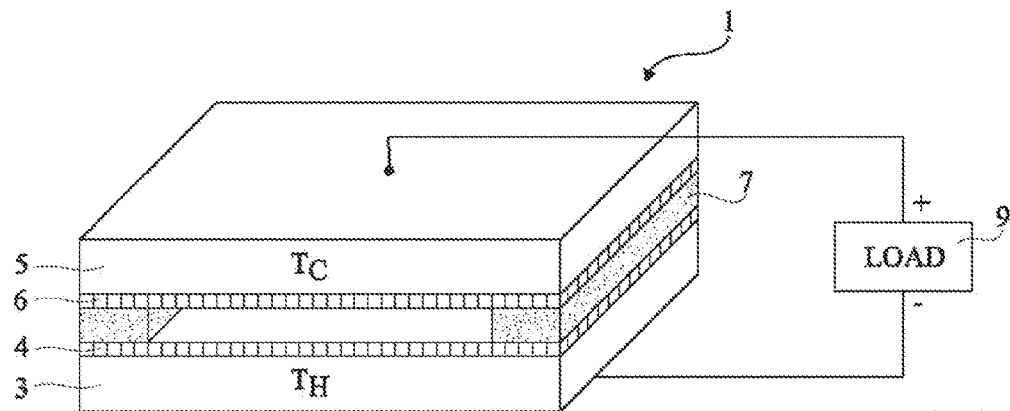
FIG. 1, previously described, is a perspective view schematically showing an example of a tunnel-effect power converter.

For clarity, the same elements have been designated with the same reference numerals in the different drawings and, further, as usual in the representation of integrated circuits, the various drawings are not to scale. Further, only those elements which are useful to the understanding of the embodiments have been shown and will be described. In particular, the various possible uses of power converters described hereafter have not been detailed, the provided converters being compatible with current uses of power converters.

Figure 2:
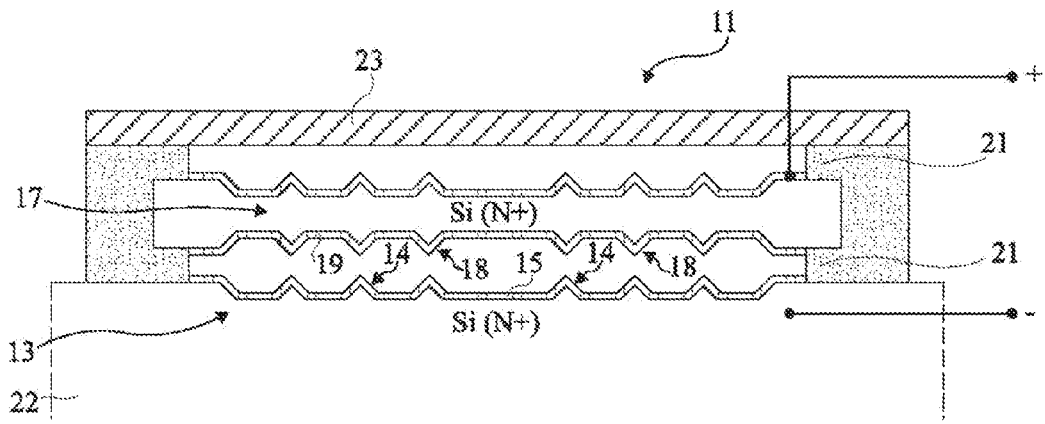
FIG. 2 is a cross-section view schematically illustrating an embodiment of a tunnel-effect power converter.

FIG. 2 is a cross-section view schematically illustrating an embodiment of a tunnel-effect power converter 11. Converter 11 comprises two electrodes 13 and 17 having opposite surfaces. A difference between converter 11 of FIG. 2 and converter 1 of FIG. 1 is that, in converter 11, the opposite electrode surfaces are not planar. In the shown example, the surface of electrode 13 opposite to electrode 17 comprises protrusions 14 extending towards electrode 17, and the surface of electrode 17 opposite to electrode 13 comprises protrusions 18 extending towards electrode 13. In this example, protrusions 18 of electrode 17 face protrusions 14 of electrode 13. In a preferred embodiment, the protrusions are point-shaped. As an example, the points have a base diameter ranging from 1 to 20 nm and a height ranging between 5 and 25 nm. The spacing step between points for example ranges between 5 and 25 nm, and the total surface area of the converter (in top view) for example has the shape of a square having a side length ranging from 500 nm to 50 µm. Opposite protrusions 14 and 18 are separated by a distance selected to enable a conduction by tunnel-effect between electrodes, for example, a distance ranging between 1 and 30 nm, and preferably ranging between 3 and 10 nm.

Electrodes 13 and 17 are, for example, made of a semiconductor material such as N-type doped single-crystal silicon, P-type doped single-crystal silicon, or undoped single-crystal silicon, and may comprise, on the side of their opposite surfaces, a thin coating (respectively 15 for electrode 13 and 19 for electrode 17) of a low work function material, for example, a metal, such as cesium, or a metal oxide, such as potassium peroxide ($K_2O_2$) or a cesium oxide ($Cs_2O$). The thickness of coatings 15 and 19 for example ranges between 1 and 10 nm, and preferably between 3 and 7 nm. To maintain the opposite surfaces at the desired distance, spacers 21 made of an electrically insulating material, for example, silicon oxide, are arranged between electrodes 13 and 17 in certain regions of converter 11, for example in peripheral regions of the converter.

In the shown example, lower electrode 13 is formed in the upper part of a portion of a semiconductor wafer 22, and upper electrode 17 is topped with a protection wafer 23, for example, made of metal. Semiconductor wafer portion 22 and protection wafer 23 may form elements of an encapsulation package of the converter. The free space within the package, and in particular between the opposite surfaces of electrodes 13 and 17 and spacers 21, may be placed in vacuum or filled with an inert gas. In this example, protection wafer 23 is electrically insulated from electrode 17, and contacts are taken on electrodes 13 and 17, for example, via the conductive coating made of a low work function material (respectively 15 for electrode 13 and 19 for electrode 17), forming electric power supply terminals of the converter.

In operation, electrode 13 (emitter) is heated, and electrode 17 (collector) is maintained at a temperature lower than that of electrode 13. Under the effect of heat, electrons are extracted from hot electrode 13 and cross the potential barrier which separates them from cold electrode 17 by thermionic emission effect. The short distance separating the opposite surfaces of electrodes 13 and 17 eases the transport of electrons from electrode 13 to electrode 17 by tunnel effect. There thus is an electron flow between hot and cold electrodes 13 and 17 and, when a load (not shown) is connected between electrodes 13 and 17, a current flows through the load going from cold electrode 17 (positive electrode) to hot electrode 13 (negative electrode).

As an example, converter 11 may be used at temperatures ranging from approximately 20 to 600° C. on the hot surface side, and from approximately −50 to 500° C. on the cold surface side, with a temperature gradient approximately ranging from 1 to 150° C. between the cold surface and the hot surface. The described embodiments are, however, not limited to such specific operating temperature ranges.

The measurements performed by the present inventors have shown that the efficiency of converter 11 is greater than the efficiency of a planar-electrode converter of the type described in relation with FIG. 1. As an example, for a given total converter surface area (in top view), the efficiency of converter 11 is approximately 600 times greater than the efficiency of a planar-electrode converter of the type described in relation with FIG. 1. The improvement of the conversion performance is especially due to the point effect which causes a local increase of the electric field at the free ends of protrusions 14 and 18. This results in a decrease of the work function at the points, which causes an increase of the total electron flow between electrodes 13 and 17, and thus an increase of the amount of the electric current capable of being generated by the converter.

Figure 3:
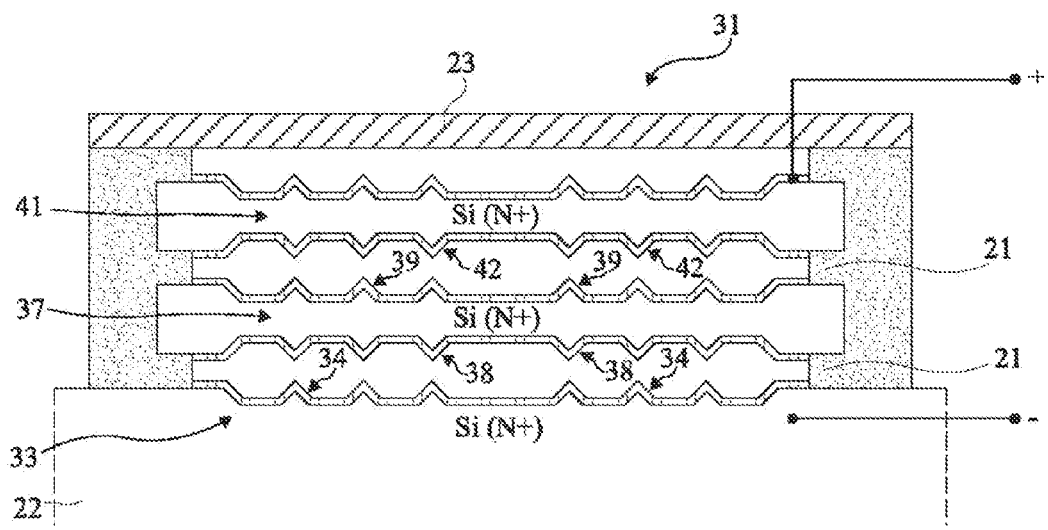
FIG. 3 is a cross-section view schematically illustrating another embodiment of a tunnel-effect power converter.

FIG. 3 is a cross-section view schematically illustrating another embodiment of a tunnel-effect power converter. Converter 31 of FIG. 3 differs from converter 11 of FIG. 2 in that it comprises a stack of three electrodes 33, 37, and 41 having opposite surfaces, instead of two. Electrodes 33 and 37 are arranged substantially in the same way as electrodes 13 and 17 of converter 11 of FIG. 2. Electrode 41 is arranged above (in the orientation of the drawing) electrode 37, electrodes 37 and 41 having opposite surfaces. The surface of electrode 33 opposite to electrode 37 comprises protrusions 34 extending towards electrode 37, and the surface of electrode 37 opposite to electrode 33 comprises protrusions 38 extending towards electrode 33, protrusions 34 of electrode 33 facing protrusions 38 of electrode 37. Further, the surface of electrode 37 opposite to electrode 41 comprises protrusions 39 extending towards electrode 41, and the surface of electrode 41 opposite to electrode 37 comprises protrusions 42 extending towards electrode 37, protrusions 39 of electrode 37 facing protrusions 42 of electrode 41. As in the example of FIG. 2, electrodes 33, 37, and 41 may comprise a coating made of a conductive material of low work function. In the shown example, contacts are taken on electrodes 33 and 41, forming electric power supply terminals of the converter.

The device of FIG. 3 corresponds to the placing in series of two tunnel-effect converters of the type described in relation with FIG. 2. An advantage of such a device is that the provided electric power is greater than in a single-stage converter. Another advantage is that the voltage under which the electric power generated by the converter is provided (between electrodes 33 and 41) is greater than in a single-stage converter. Another advantage is that in such a converter, the distance between the hot and cold surfaces of the converter is greater than in a single-stage converter, which enables to more easily maintain a significant temperature gradient between the hot surface and the cold surface.

More generally, it will be within the abilities of those skilled in the art to adapt the number of stages of the converter according to the targeted application, and in particular to provide a converter comprising more than three superposed electrodes. It will also be within the abilities of those skilled in the art to form a converter with several stages in which the stages are connected in parallel, rather than in series as in the example of FIG. 3.

FIGS. 4A to 4H are cross-section views schematically illustrating steps of a method for forming a tunnel-effect power converter of the type described in relation with FIG. 3.

Figure 4A:
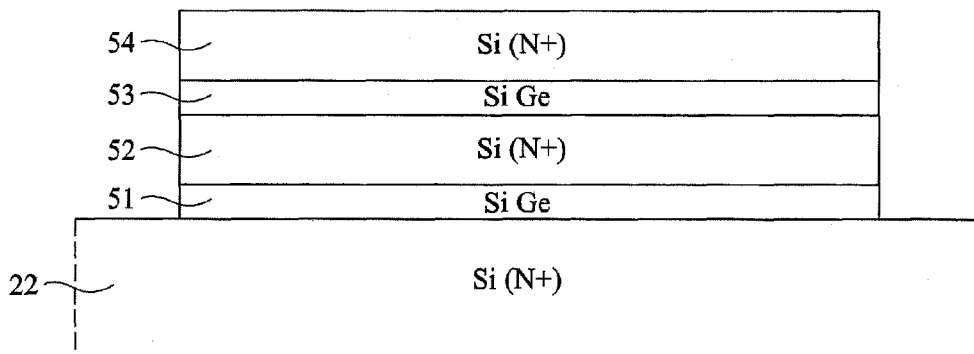
FIGS. 4A to 4H are cross-section views schematically illustrating steps of a method for forming a tunnel-effect power converter.

FIG. 4A illustrates an initial structure comprising a portion 22 of an N-type doped silicon semiconductor substrate (Si(N$^+$)), and a stack comprising, in the order from the surface of the substrate, a layer 51 made of a silicon-germanium alloy (SiGe), an N-type doped silicon layer 52 (Si(N$^+$)), a layer 53 of a silicon-germanium alloy (SiGe), and an N-type doped silicon layer 54 ((Si(N$^-$)). As a variation, substrate 22 and layers 52 and 54 may be made of P-type doped silicon, or of undoped silicon, or of other adapted materials. Layers 51, 52, 53, and 54 are for example formed by epitaxy over the entire surface of substrate 22, where a portion of the stack can then be delimited by etching, thus resulting in the structure of FIG. 4A. In an embodiment, silicon-germanium layers 51 and 53 have a thickness on the order of 15 nm, and silicon layers 52 and 54 have a thickness on the order of 60 nm.

Figure 4B:
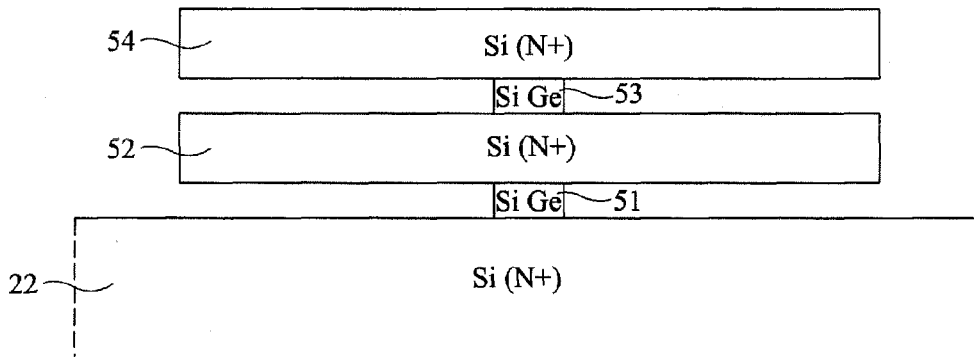

FIG. 4B illustrates a step of partial removal of silicon-germanium layers 51 and 53, by selective etching. A small portion only of layers 51 and 53 is kept in the central portion of the block, to avoid a collapsing of the block. As an example, the partial removal of layers 51 and 53 is performed by plasma etching or by chemical etching.

Figure 4C:
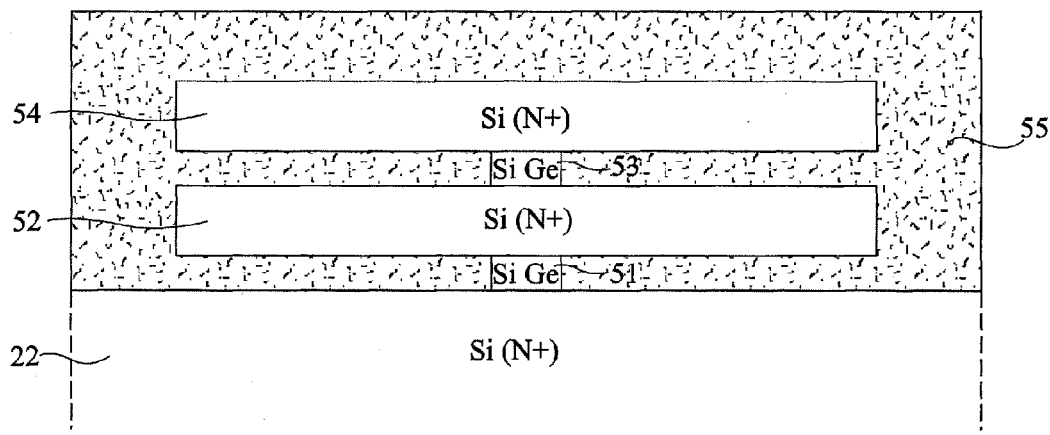

FIG. 4C illustrates a step of filling of the spaces left free between layers 52 and 54 after the partial removal of layers 51 and 53, with a resin 55. In this example, the stack is totally embedded in resin 55, that is, its lateral and upper surfaces are also covered with resin 55. Resin 55 for example is hydrogen silsesquioxane (H$_8$Si$_8$O$_{12}$), generally designated as HSQ in the art, which is a negative resin sensitive to electrons having the property of turning into silicon oxide after exposure, development, and anneal. The described method is however not limited to the use of this specific resin.

Figure 4D:
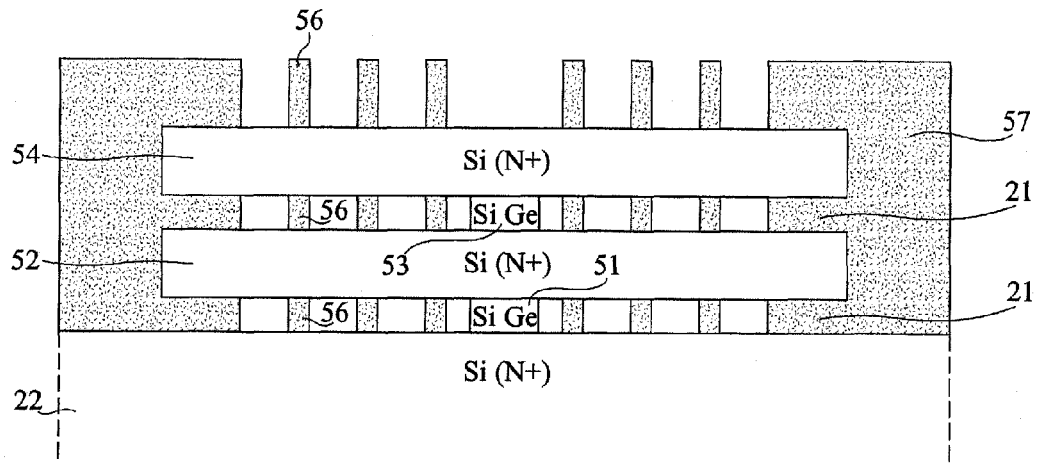

FIG. 4D illustrates a step of etching of a pattern in resin 55. Resin strips forming a grid in top view are removed. The resin is for example exposed by means of an electron beam scanning the upper surface of the stack. The electrons cross the silicon of layers 52 and 54 so that the resin is exposed along the entire height of the stack. A development step is then provided to only keep islands 56 of non-exposed resin, vertically aligned between substrate 22 and layer 52, between layer 52 and layer 54, and at the surface of layer 54. As an example, islands 56 have a width of approximately 10 nm, and neighboring islands 56 are separated by a distance approximately ranging from 10 to 20 nm, corresponding to the width of the removed resin strips. In the peripheral region of the stack, regions 21 of resin 55 are kept to form spacers between the converter electrodes. An anneal can then be provided to transform resin 55 into silicon oxide 57.

Figure 4E:
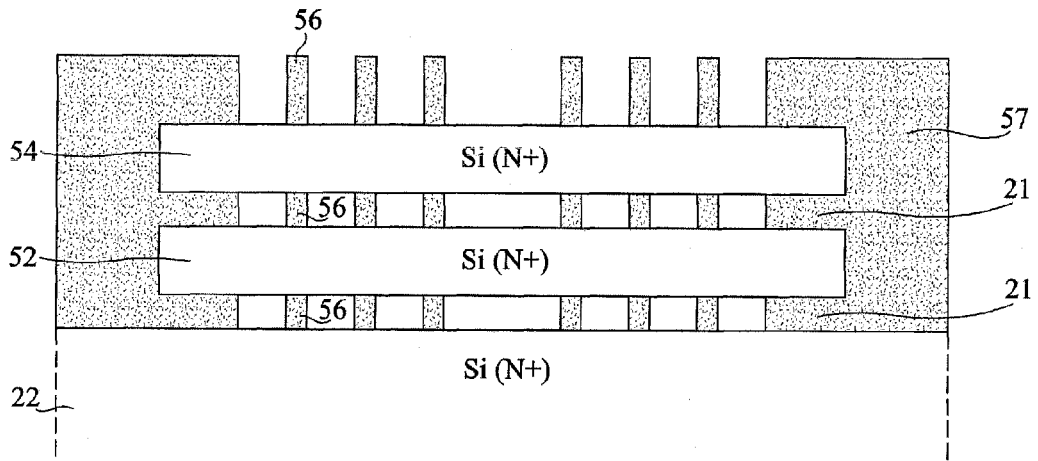

FIG. 4E illustrates a step of removal of the remaining portions of silicon-germanium layers 51 and 53. At this stage, the remaining portions of layers 51 and 53 may be removed with no risk for the structure to collapse, due to the presence of the silicon oxide pattern which interposes between silicon layers 22, 52, and 54, and in particular due to the presence of spacers 21.

Figure 4F:
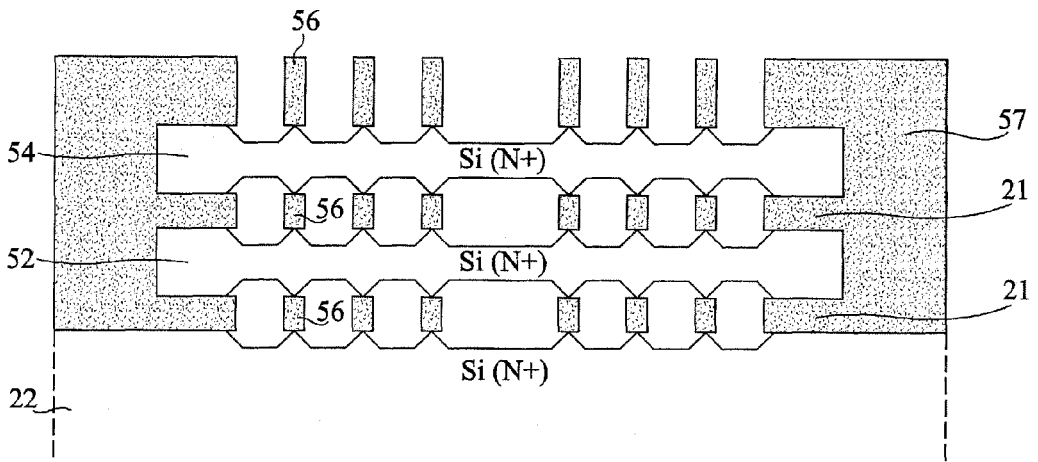

FIG. 4F illustrates a step during which silicon layers 22, 52, and 54 are partially etched by means of a solution preferentially etching oblique crystal planes of the silicon, for example, a solution based on potassium hydroxide (KOH). This has resulted in thinning the silicon layer at the level of the regions unmasked by silicon oxide islands 56. At the end of this step, the partially thinned silicon layer has point-shaped protrusions at the level of the regions masked by islands 56.

Figure 4G:
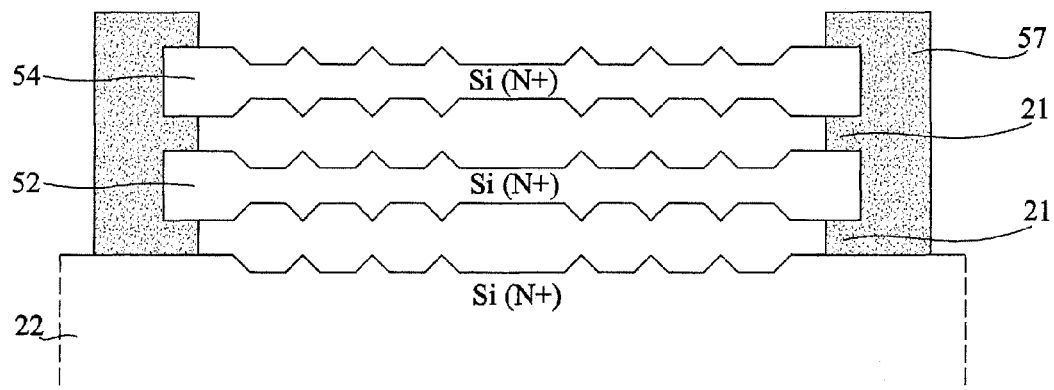

FIG. 4G illustrates a step of removal of islands 56, for example, by means of a hydrofluoric acid solution. Silicon oxide regions 57 forming spacers 21 are at least partially kept.

Figure 4H:
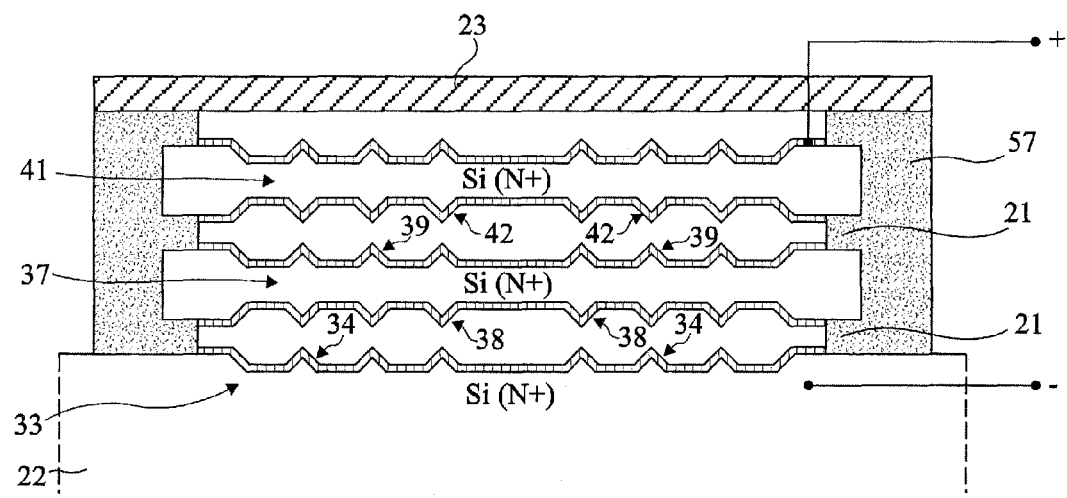

FIG. 4H illustrates a step of deposition, at the surface of silicon regions 22, 52, and 54, of a thin coating of an electrically conductive material of low work function, for example, a metal, such as cesium, or a metal oxide, such as potassium peroxide (K$_2$O$_2$) or a cesium oxide (Cs$_2$O). As an example, a cesium oxide coating is formed by sputtering, or by deposition in successive atomic layers according to a method presently called ALD in the art (Atomic Layer Deposition).

The converter is then encapsulated in a package, for example, comprising a protection wafer 23 topping upper electrode 41. Contacts are taken on electrodes 33 and 41, forming electric power supply terminals of the converter.

Specific embodiments have been described. Various alterations, modifications and improvements will readily occur to those skilled in the art.

In particular, embodiments in which electrodes of the tunnel-effect power converter are partly formed in silicon have been described hereabove. The present invention is not limited to this specific case. It will be within the abilities of those skilled in the art to adapt the provided structure by using other materials than those mentioned hereabove, for example, metals, since the selected materials are compatible with the forming of protrusions, preferably pointed, at the surface of the electrodes.

Further, in the above-described embodiments, the hot and cold electrodes comprise opposite protrusions. A structure in which only the hot electrode has protrusions extending towards the cold electrode may also be provided, the cold electrode having a planar surface.

Further, the above-described examples of converters comprise a single stack portion comprising electrodes having opposite surfaces. It will be within the abilities of those skilled in the art to form a converter comprising, on a same semiconductor substrate, a plurality of juxtaposed stack portions, each corresponding to a structure of the type described in relation with FIG. 2 or 3.

Further, a method for manufacturing tunnel-effect power converters has been described hereabove as an example (FIGS. 4A to 4H). It will be within the abilities of those skilled in the art to adapt the provided method and use any other known manufacturing method to manufacture converters of the type described in relation with FIGS. 2 and 3.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A tunnel-effect power converter, comprising:
   a semiconductor substrate;
   a first electrode on the semiconductor substrate, the first electrode including a first surface having a first plurality of protrusions, the first electrode being in a fixed position with respect to the semiconductor substrate;
   a second electrode having a second surface, the second surface facing the first surface of the first electrode, the second surface having a second plurality of protrusions, each of the first plurality of protrusions being aligned with a respective protrusion of the second plurality of protrusions, the second electrode being separated from the semiconductor substrate by the first electrode; and a spacer on the semiconductor substrate, the spacer configured to space the first electrode from the second electrode and hold the second electrode in a fixed position with respect to the semiconductor substrate.

2. The tunnel-effect power converter of claim 1, further comprising:

a third electrode having a third surface, the second electrode having a fourth surface facing the third surface of the third electrode, the third surface having a third plurality of protrusions.

3. The tunnel-effect power converter of claim 2, wherein the third surface has a third plurality of protrusions, the fourth surface has a fourth plurality of protrusions, and each of the third plurality of protrusions are aligned with a respective protrusion of the fourth plurality of protrusions.

4. The tunnel-effect power converter of claim 1, wherein each of the first and the second plurality of protrusions is pointed.

5. The tunnel-effect power converter of claim 4, wherein each of the first and the second plurality of protrusions a height in the range of 5 and 25 nm.

6. The tunnel-effect power converter of claim 1, wherein the first surface is spaced from the second surface by a distance in the range of 1 and 30 nm.

7. The tunnel-effect power converter of claim 1, further comprising:

a first conductive layer on at least a portion of the first surface; and a second conductive layer on the second surface, the first and second conductive layers being cesium, cesium oxides, or potassium peroxide.

8. The tunnel-effect power converter of claim 1, wherein the support structure is made of an insulating material, and the first electrode is electrically insulated from the second electrode.

9. The tunnel-effect power converter of claim 1, wherein the second electrode has a third surface opposite to the second surface, the third surface having a third plurality of protrusions.

10. The tunnel-effect power converter of claim 1, wherein the second electrode includes a third surface opposite to the second surface, the third surface having a third plurality of protrusions.

11. The tunnel-effect power converter of claim 10, further comprising:

a first conductive layer on the first surface of the first electrode;

a second conductive layer on the second surface of the second electrode; and a third conductive layer on the third surface of the second electrode.

12. The tunnel-effect power converter of claim 1, wherein the spacer includes first and second portions on the semiconductor substrate, the first and second electrodes being between the first and second portions of the spacer.

13. The tunnel-effect power converter of claim 1, further comprising a protection layer on the spacer, the first and second electrodes being between the semiconductor substrate and the protection layer.

14. A method, comprising:

forming a first electrode on a semiconductor substrate, the first electrode having a first surface, the first electrode being in a fixed position with respect to the semiconductor substrate;

forming a second electrode overlying the first electrode, the second electrode having a second surface facing the first surface of the first electrode, the second electrode being separated from the semiconductor substrate by the first electrode;

forming a spacer on the semiconductor substrate, the spacer configured to hold the second electrode in a fixed position with respect to the semiconductor substrate and create a space between the first electrode and the second electrode;

forming a first plurality of protrusions on the first surface by removing portions of the first electrode; and forming a second plurality of protrusions on the second surface by removing portions of the second electrode.

15. The method of claim 14, further comprising:

forming a first conductive layer on the first surface of the first electrode; and forming a second conductive layer on the second surface of the second electrode.

16. The method of claim 15, wherein the first and second electrodes each have a first work function, and the first and second conductive layers have a second work function that is lower than the first work function.

17. The method of claim 14, further comprising:

heating the first electrode to a first temperature; and maintaining the second electrode at a second temperature that is lower than the first temperature.

18. The method of claim 14, wherein the spacer is made of an insulating material.

19. The method of claim 14, further comprising:

forming resin or oxide islands masking regions of a single crystal silicon layer; and partially thinning the single crystal silicon layer by a solution etching oblique crystal planes of the single crystal silicon layer.

20. A power converter, comprising:

a semiconductor substrate;

a first electrode on the semiconductor substrate, the first electrode having a first plurality of protrusions, the first electrode being in a fixed position with respect to the semiconductor substrate;

a second electrode overlying the first electrode, the second electrode having a second plurality of protrusions and a third plurality of protrusions, the first and second plurality of protrusions extending towards each other;

a third electrode overlying the first and second electrode, the third electrode having a fourth plurality of protrusions, the third and the fourth plurality of protrusions extending towards each other, the third electrode being separated from the semiconductor substrate by the first electrode and the second electrode; and insulating material configured to space the first, second, and third electrodes from each other and hold the second and the third electrodes in fixed positions with respect to the semiconductor substrate.

21. The power converter of claim 20, wherein the first electrode is fixed on a surface of a semiconductor substrate.

22. The power converter of claim 20, wherein the third electrode has a fifth plurality of protrusions, the fourth plurality of protrusions extending in a first direction, and the fifth plurality of protrusions extending in a second direction that is opposite to the first direction.

23. The power converter of claim 20, wherein the first, second, third, and fourth plurality of protrusions are aligned with each other.

\* \* \* \* \*